United States Patent
Lin et al.

(10) Patent No.: US 7,334,170 B2
(45) Date of Patent: Feb. 19, 2008

(54) METHOD FOR RESOLVING PARAMETERS OF DRAM

(75) Inventors: Joe Lin, Taipei Hsien (TW); Jenchieh Chen, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 366 days.

(21) Appl. No.: 11/160,129

(22) Filed: Jun. 9, 2005

(65) Prior Publication Data

US 2006/0047892 A1    Mar. 2, 2006

(30) Foreign Application Priority Data

Aug. 27, 2004   (TW) .............................. 93125967 A

(51) Int. Cl.
*G11C 29/00*    (2006.01)

(52) U.S. Cl. .................................... 714/718
(58) Field of Classification Search .................... None
See application file for complete search history.

(56) References Cited

U.S. PATENT DOCUMENTS 5,623,638 A * 4/1997 Andrade ..................... 711/167
6,134,638 A * 10/2000 Olarig et al. ............... 711/167
6,182,253 B1 * 1/2001 Lawrence et al. .......... 714/718

* cited by examiner

*Primary Examiner*—Phung M. Chung
(74) *Attorney, Agent, or Firm*—Winston Hsu

(57) ABSTRACT

A method for resolving DRAM parameters includes setting a chip number, a DIMM number and a DRAM bank number of the DRAM according to the chip number, the DIMM number and the DRAM bank number recorded on a SPD of the DRAM. The method further includes initializing the DRAM with an untested candidate of an untested parameter, default values of other untested parameters, and confirmed values of tested parameters and setting the candidate as the confirmed value of the parameter when the initialization succeeds.

18 Claims, 3 Drawing Sheets

METHOD FOR RESOLVING PARAMETERS OF DRAM

BACKGROUND OF THE INVENTION

1. Field of the Invention

The present invention relates to a method for resolving parameters of DRAM (Dynamic Random Access Memory), and more particularly, to a method for testing an untested DRAM parameter set to an untested predetermined value to initialize the DRAM.

2. Description of the Prior Art

During computer initialization the data stored in the BIOS (Basic Input/Output System) is copied to DRAM (Dynamic Random Access Memory). A DRAM initialization is required for the host to acquire the DRAM capacity. In the prior art, the BIOS reads the SPD (Serial Presence Detect) directly from the DRAM and gets all necessary date for DRAM initialization. SPD is an EEPROM (Electrically Erasable Programmable Read-Only Memory) device of smaller size than normal DRAM. SPD contains data of 128-byte length. Each byte represents a specific meaning, indicating detailed DRAM information, including DRAM size, DRAM type, performance parameters, vendor information, etc. In the prior art, the BIOS reads the chip number, the DIMM (dual inline memory module) number, DRAM bank number, the bank interleave parameter, the DRAM timing parameter, the DRAM driving parameter, etc. directly from the SPD of the DRAM. The data read from the SPD is used to set all DRAM parameters and the DRAM initialization is processed based on this DRAM parameter setting.

However, if the DRAM parameters are set based on the wrong data directly read from the SPD, it can lead to DRAM initialization failure. Especially when the DRAM timing parameter and the operating frequency parameter are set to wrong values, the whole system can crash. Or, if the information stored on the SPD is altered using a special write/read device, the BIOS will then get wrong information, which is a hidden danger in computer applications, especially in server DRAMS.

SUMMARY OF THE INVENTION

It is therefore a primary objective of the claimed invention to provide a method for resolving parameters of DRAM (Dynamic Random Access Memory), and to set DRAM parameters to values that have been tested and confirmed.

Briefly described, the present invention discloses a method for resolving parameters of DRAM. The method comprises setting a chip number, a DIMM (dual inline memory module) number and a DRAM bank number for the DRAM according to the chip number, the DIMM number and the DRAM bank number stored on a SPD (Serial Presence Detect) of the DRAM. The method further comprises setting an untested parameter as a testing parameter, setting the testing parameter to a corresponding untested candidate of predetermined values, initializing the DRAM using the testing parameter, other untested parameters set to default values and tested parameters set to confirmed values, and setting the current value of the testing parameter to the confirmed value of the testing parameter if the initialization succeeds.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
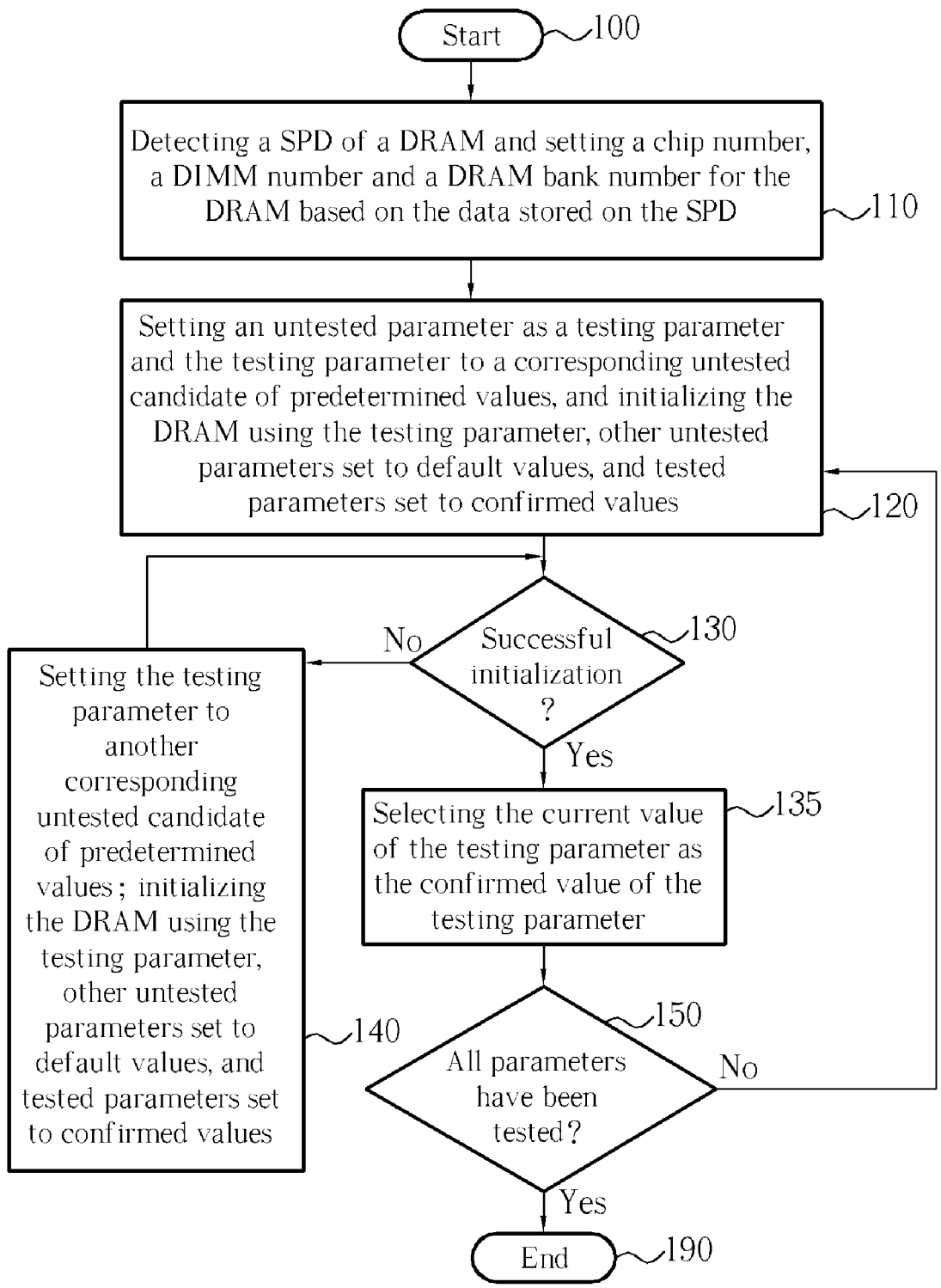
FIG. 1 is a flow chart illustrating a first preferred embodiment in the present invention.

Please refer to FIG. 1. FIG. 1 is a flow chart illustrating a first preferred embodiment in the present invention. Steps illustrated in the flow chart will be described below.

Step 100: Start;

Step 110: Detecting a SPD (Serial Presence Detect) of a DRAM (Dynamic Random Access Memory) and based on the data stored on the SPD, setting a chip number, a DIMM (dual inline memory module) number and a DRAM bank number for the DRAM;

Step 120: Setting an untested parameter as a testing parameter and the testing parameter to a corresponding untested candidate of predetermined values, and initializing the DRAM using the testing parameter, other untested parameters set to default values, and tested parameters set to confirmed values;

Step 130: Checking if the initialization succeeds; if yes, executing step 135; if no, executing Step 140;

Step 135: Selecting the current value of the testing parameter as the confirmed value of the testing parameter and executing Step 150;

Step 140: Setting the testing parameter to another corresponding untested candidate of predetermined values; initializing the DRAM using the testing parameter, other untested parameters set to default values and tested parameters set to confirmed values and executing Step 130;

Step 150: Checking if all parameter have been tested; if yes, executing Step 190; if not, executing Step 120;

Step 190: End.

Compared to the prior art in which the DRAM is initialized based on the parameter settings stored on the SPD, the present invention uses the chip number, the DIMM number, the DRAM bank number and other parameters that have been tested and confirmed. For example, if the DRAM operating frequency is being resolved first, the BIOS sets the DRAM chip number, the DIMM number and the DRAM bank number according to the data stored on the SPD. Among a plurality of untested candidates of predetermined values, ex: 100 MHz, 133 MHz and 266 MHz, a value is selected for the DRAM operating frequency. For instance, the DRAM operating frequency is set to 100 MHz and other parameters are set to their respective default values. Then the DRAM is initialized based on the above-mentioned settings. If the initialization fails, the DRAM operating frequency is then set to another untested candidate of predetermined values, ex: 133 MHz, and other parameters are still set to their respective default values. Then the DRAM is initialized again based on these new settings. If the DRAM is initialized successfully when the operating frequency is set to 133 MHz, then the DRAM operating frequency set to 133 MHz is confirmed and resolved. When the system continues to test other parameters, for example the next testing parameter being the bank interleave parameter, the BIOS sets the DRAM chip number, the DIMM number and the DRAM bank number according to the data stored on the SPD, sets the bank interleave parameter to "On", other untested parameters to their respective default values and the tested operating frequency parameter to its confirmed value, i.e. 133 MHz. Then the DRAM is initialized based on the above-mentioned settings. Similarly if the initialization succeeds, the bank interleave parameter is set to the confirmed value "On"; if the initialization fails, the bank interleave parameter is set to "Off" and the initialization is repeated again. By this way of the present invention all DRAM parameters can be tested and confirmed for a successful DRAM initialization.

According to the flow chart in FIG. 1 and the above description, the present invention provides a method for testing the DRAM operating frequency, bank interleave parameter, DRAM timing parameter, and DRAM driving parameter, etc. The DRAM parameters are tested and resolved in the present invention, and therefore the present invention greatly increases the success rate of system initialization.

Among the above-mentioned DRAM parameters, the DRAM driving parameter is the most important one and allows no margin of error. The present invention further provides a method for testing and resolving the DRAM driving parameter based on the confirmed values of other parameters and on a predetermined rule. Please refer to FIG. 2. for a flow chart of a second preferred embodiment of the present invention for resolving DRAM parameters. Steps illustrated in the flow chart will be described below.

Step 200: Start;

Step 210: Detecting a SPD of a DRAM and based on the data stored on the SPD, setting a chip number, a DIMM number and a DRAM bank number for the DRAM;

Step 220: Setting an untested parameter as a testing parameter and the testing parameter to a corresponding untested candidate of predetermined values, and initializing the DRAM using the testing parameter, other untested parameters set to default values and tested parameters set to confirmed values;

Step 230: Checking if the initialization succeeds; if yes, executing step 235; if no, executing Step 240;

Step 235: Selecting the current value of the testing parameter as the confirmed value of the testing parameter and executing Step 250;

Step 240: Setting the testing parameter to another corresponding untested candidate of predetermined values; initializing the DRAM using the testing parameter, other untested parameters set to default values and tested parameters set to confirmed values and executing Step 230;

Step 250: Checking if all parameter have been tested; if yes, executing Step 260; if not, executing Step 220;

Step 260: According to the chip number, the DIMM number and the DRAM bank number set in Step 210, setting the tested parameters to confirmed values and the DRAM driving parameter to an untested candidate of predetermined values based on the predetermined rule, and initializing the DRAM; executing Step 270;

Step 270: Checking if the initialization succeeds; if yes, executing step 275; if no, executing Step 280;

Step 275: Selecting the current DRAM driving parameter as the confirmed value and executing Step 290;

Step 280: Initializing the DRAM based on the chip number, the DIMM number and the DRAM bank number set in Step 210, the tested parameters set to confirmed values and the DRAM driving parameter set to another untested candidate of predetermined values and a predetermined rule; executing Step 270;

Step 290: End.

Figure 2:
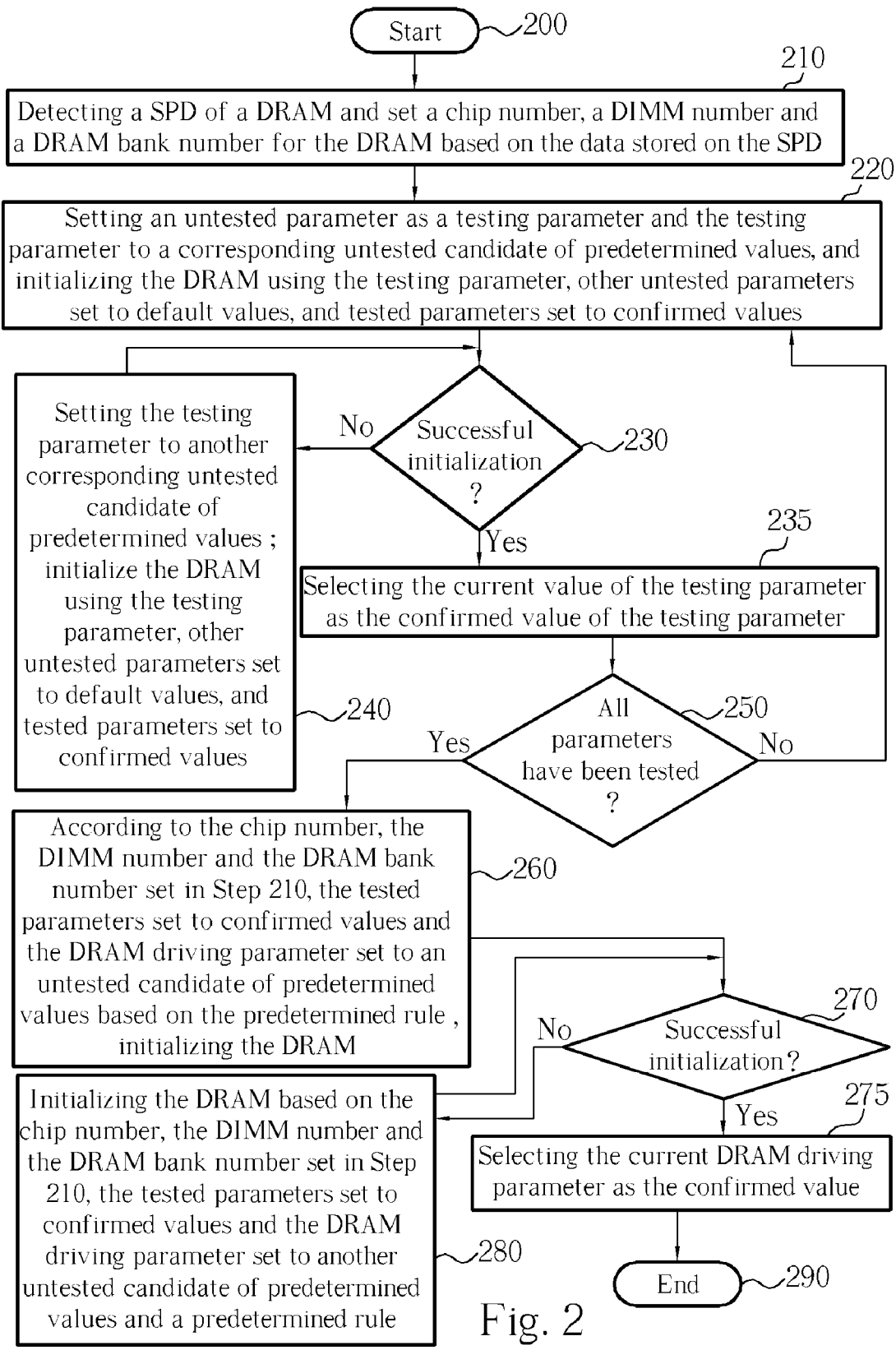
FIG. 2 is a flow chart of a second preferred embodiment of the present invention for resolving DRAM parameters.

In the embodiment of the present invention illustrated in FIG. 2, the DRAM driving parameter is resolved not only by testing candidates of predetermined values, but also by testing the chip number, the DIMM number, the DRAM bank number and other tested parameters set to confirmed values, as illustrated in step 260. And according to a predetermined rule, the DRAM parameter is resolved for DRAM initialization. If the initialization fails with this setting, the DRAM driving parameter is set to another untested candidate of predetermined values and the DRAM is initialized again. The advantage of resolving the DRAM driving parameter according to a predetermined rule and setting other parameters to confirmed values is that under normal situations this DRAM driving parameter setting is usually an effective setting capable of initializing the DRAM successfully. This method reduces the test time for resolving DRAM parameters. At the same time, the present invention still preserves the function of testing the DRAM driving parameter set to other candidates of predetermined values in the situation when the DRAM driving parameter setting based on a predetermined rule fails to initialize the DRAM successfully. Also, the present invention can be designed to start testing the DRAM driving parameter with lower values among the predetermined values in order to save power.

The flow charts in FIG. 1 and FIG. 2 only indicate setting each untested parameter to different candidates of predetermined values sequentially for DRAM initialization. In practice, the BIOS can test and resolve each DRAM parameter according to a predetermined rule and a predetermined order. Also the DRAM driving parameter can tested by starting with lower values among the predetermined values for power-saving purpose, or according to other predetermined testing orders for other purposes.

In the present invention illustrated in FIG. 1 and FIG. 2, some DRAM parameters, such as the DRAM chip number, the DIMM number and DRAM bank number, are set to confirmed values according to the data stored in SPD. In other words these parameters are not tested again when resolving other DRAM parameters. However, the present invention also provides a method for re-testing and re-confirming these parameters, such as the DRAM chip number, the DIMM number and DRAM bank number, by selecting the data stored in the SPD as the default values, not the confirmed values, for these DRAM parameters. Please refer to FIG. 3. for a flow chart of a third preferred embodiment of the present invention for resolving DRAM parameters. Steps illustrated in the flow chart will be described below.

Step 300: Start;

Step 310: Detecting a SPD of a DRAM and, set a chip number, a DIMM number and a DRAM bank number to default values based on the data stored on the SPD;

Step 320: Setting an untested parameter as a testing parameter and the testing parameter to a corresponding untested candidate of predetermined values, and initializing the DRAM using the testing parameter, other untested parameters set to default values and tested parameters set to confirmed values;

Step 330: Checking if the initialization succeeds; if yes, executing step 35; if no, executing Step 340;

Step 335: Selecting the current value of the testing parameter as the confirmed value of the testing parameter and executing Step 350;

Step 340: Setting the testing parameter to another corresponding untested candidate of predetermined values; initializing the DRAM using the testing parameter, other untested parameters set to default values and tested parameters set to confirmed values and executing Step 330;

Step 350: Checking if all parameter have been tested; if yes, executing Step 360; if not, executing Step 320;

Step 360: Initializing the DRAM using the tested parameters set to confirmed values and a DRAM driving parameter set to an untested candidate of predetermined values based on the predetermined rule; executing Step 370;

Step 370: Checking if the initialization succeeds; if yes, selecting the current DRAM driving parameter as the confirmed value and executing Step 390; if no, executing Step 380;

Step 375: Selecting the current DRAM driving parameter as the confirmed value and executing Step 390;

Step 380: Initializing the DRAM using the tested parameters set to confirmed values and the DRAM driving parameter set to another untested candidate of predetermined values based on the predetermined rule; executing Step 370;

Step 390: End.

Figure 3:
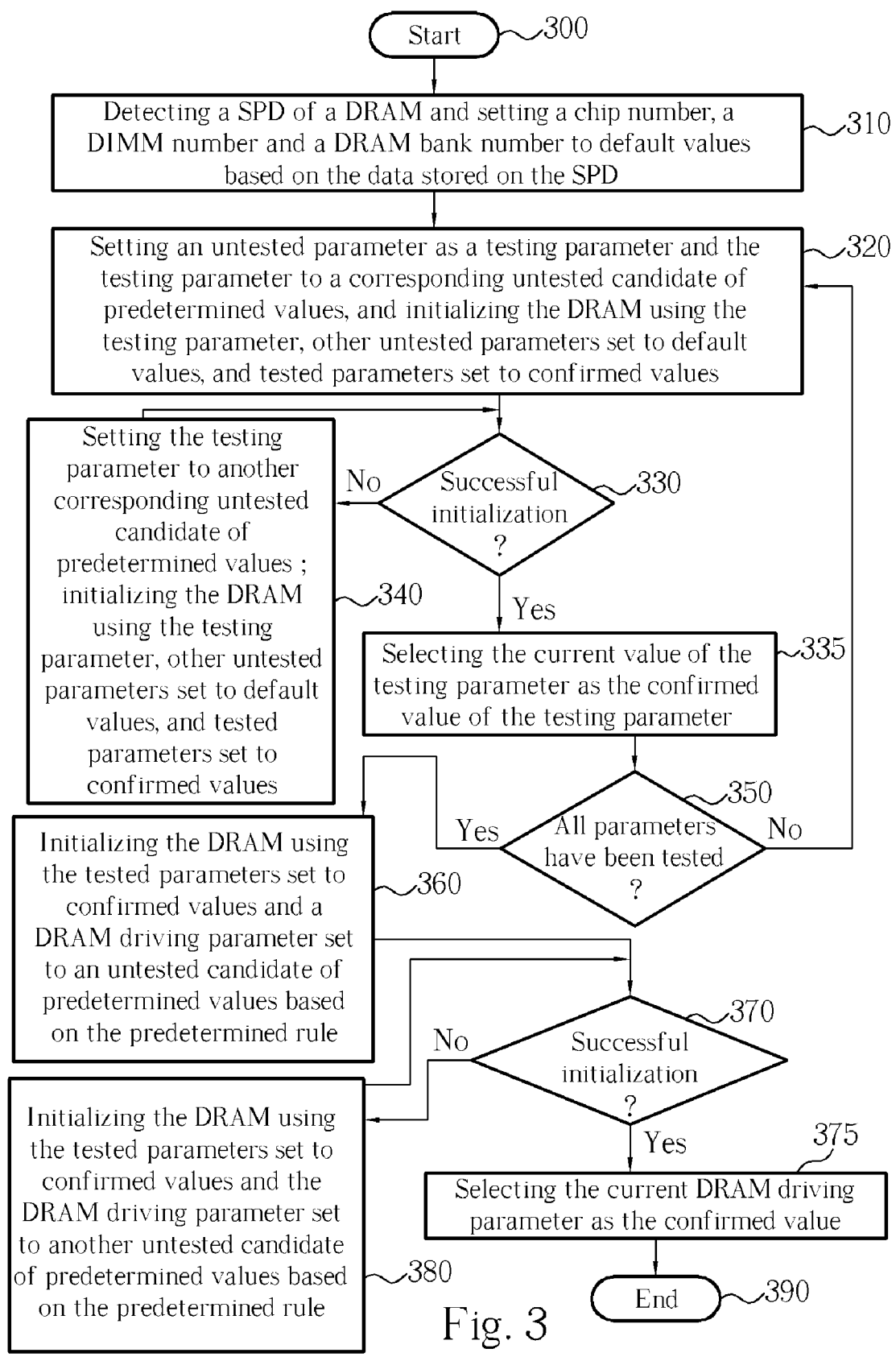
FIG. 3 is a flow chart of a third preferred embodiment of the present invention for resolving DRAM parameters.

The flow chart in FIG. 3 is similar to that in FIG. 2. But in FIG. 3, the data stored in the SPD is selected as the default values instead of as the confirmed values. In other words, these parameters still belong to untested parameters and have to be tested and confirmed in Step 320 and thereafter. In step 310 for DRAM parameters set to default values based on the data stored in the SPD, these default values can be selected as testing values first for these DRAM parameter to save test time.

In conclusion, the present invention uses the data stored on the SPD for some DRAM parameters, tests and confirms some or all parameters of the DRAM to avoid unsuccessful system initialization resulting from wrong DRAM parameters. The present invention also solves the problem of altered SPD data in the prior art where the SPD data is used for system initialization without being confirmed first.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for resolving parameters of DRAM (Dynamic Random Access Memory), said method comprising:
   setting a chip number, a DIMM number (dual inline memory module number) and a DRAM bank number for the DRAM according to the chip number, the DIMM number and the DRAM bank number stored on a SPD (Serial Presence Detect) of the DRAM;
   setting an untested parameter as a testing parameter;
   setting the testing parameter to a corresponding untested candidate of predetermined values;
   initializing the DRAM using the testing parameter, other untested parameters set to default values and tested parameters set to confirmed values; and
   selecting the current value of the testing parameter as the confirmed value of the testing parameter if the initialization succeeds.

2. The method of claim 1 further comprising:
   setting a DRAM driving parameter to a testing value according to the chip number, the DIMM number, the DRAM bank number, the untested parameters set to the default values, the tested parameters set to the confirmed values and a predetermined rule;
   initializing the DRAM using the DRAM driving parameter; and
   selecting the testing value of the DRAM driving parameter as the confirmed value of the DRAM driving parameter if the initialization succeeds.

3. The method of claim 1 further comprising: setting a DRAM driving parameter according to the chip number, the DIMM number, the DRAM bank number, the untested parameters set to the default values, the tested parameters set to the confirmed values and a predetermined rule.

4. The method of claim 1 further comprising:
   setting another untested parameter as the testing parameter when not all the parameters are tested;
   setting the testing parameter to the corresponding untested candidate of predetermined values; and
   initializing the DRAM using the testing parameter, the untested parameters set to the default values and the tested parameters set to the confirmed values.

5. The method of claim 1, wherein the DRAM parameters include an operating frequency parameter.

6. The method of claim 5 further comprising: initializing the DRAM using the operating frequency parameter stored on the SPD when the operating frequency parameter is the testing parameter and when the untested candidates of the predetermined values include an operating frequency parameter stored on the SPD.

7. The method of claim 1, wherein the DRAM parameters include a bank interleave parameter.

8. The method of claim 7, wherein the candidate of the predetermined values includes "on" and "off" when the bank interleave parameter is the testing parameter.

9. The method of claim 1, wherein the DRAM parameters include a DRAM timing parameter.

10. The method of claim 9 further comprising: initializing the DRAM using the DRAM timing parameter stored on the SPD when the DRAM timing parameter is the testing parameter and when the untested candidates of the predetermined values include a DRAM timing parameter stored on the SPD.

11. The method of claim 1 further comprising: initializing the DRAM using the chip number recorded on the SPD, the untested parameters set to the default values and the tested parameters set to the confirmed values.

12. The method of claim 11 further comprising:
   setting the chip number to an untested candidate of the predetermined values if initialization fails;
   initializing the DRAM using the chip number, the untested parameters set to the default values and tested parameters set to the confirmed values; and
   selecting the current chip number as a confirmed candidate of the predetermined values if initialization succeeds.

13. The method of claim 1 further comprising: initializing the DRAM using the DRAM bank number recorded on the SPD, the untested parameters set to the default values and the tested parameters set to the confirmed values.

14. The method of claim 13 further comprising:
   setting the DRAM bank number to an untested candidate of the predetermined values if the initialization fails;
   initializing the DRAM using the DRAM bank number, the untested parameters set to default values and tested parameters set to confirmed values; and
   selecting the current DRAM bank number as a confirmed candidate of the predetermined values if initialization succeeds.

15. The method of claim 1 further comprising: initializing the DRAM using the DIMM number recorded on the SPD, the untested parameters set to the default values and the tested parameters set to the confirmed values.

16. The method of claim 15 further comprising:
   setting the DIMM number to an untested candidate of the predetermined values if the initialization fails;

initializing the DRAM using the DIMM number, the untested parameters set to the default values and tested parameters set to the confirmed values; and selecting the current DIMM number as the confirmed candidate of the predetermined values if initialization succeeds.

17. The method of claim 1, wherein the DRAM parameters include a DRAM driving parameter.

18. The method of claim 1 further comprising: evaluating a DRAM capacity.

* * * * *